US012751058B2

(12) United States Patent
Romano et al.

(10) Patent No.: US 12,751,058 B2
(45) Date of Patent: Sep. 29, 2026

(54) SEMICONDUCTOR DEVICE AND MANUFACTURING METHOD

(71) Applicant: Hitachi Energy Ltd, Zürich (CH)

(72) Inventors: Gianpaolo Romano, Baden (CH); Giovanni Alfieri, Möriken (CH); Andrei Mihaila, Rieden (CH); Yulieth Cristina Arango, Zürich (CH)

(73) Assignee: HITACHI ENERGY LTD, Zurich (CH)

(*) Notice: Subject to any disclaimer, the term of this patent is extended or adjusted under 35 U.S.C. 154(b) by 0 days.

(21) Appl. No.: 19/115,481

(22) PCT Filed: Sep. 30, 2022

(86) PCT No.: PCT/EP2022/077321
§ 371 (c)(1),
(2) Date: Mar. 26, 2025

(87) PCT Pub. No.: WO2024/067998
PCT Pub. Date: Apr. 4, 2024

(65) Prior Publication Data

US 2026/0006874 A1 Jan. 1, 2026

(51) Int. Cl.
*H10D 30/66* (2025.01)
*H10D 12/00* (2025.01)
(Continued)

(52) U.S. Cl.
CPC ......... *H10D 62/153* (2025.01); *H10D 12/441* (2025.01); *H10D 30/66* (2025.01);
(Continued)

(58) Field of Classification Search
CPC ............ H10D 62/153; H10D 62/8325; H10D 12/441; H10D 12/481; H10D 30/66;
(Continued)

(56) References Cited

U.S. PATENT DOCUMENTS

| | | | | |
|---|---|---|---|---|
| 6,437,419 | B1 * | 8/2002 | Bhalla ................ | H10D 30/0293 257/E29.037 |
| 8,310,006 | B2 | 11/2012 | Blanchard et al. | |

(Continued)

OTHER PUBLICATIONS

Alfieri et al., "Annealing behavior between room temperature and 2000° C. of deep level defects in electron-irradiated n-type 4H silicon carbide", Journal of Applied Physics, Aug. 2005, 7 pages.

(Continued)

*Primary Examiner* — Monica D Harrison
(74) *Attorney, Agent, or Firm* — PROCOPIO, CORY, HARGREAVES & SAVITCH LLP

(57) ABSTRACT

A semiconductor device comprises a semiconductor body, a gate electrode and a first electrode, wherein—the semiconductor body comprises a first region which is a source region or an emitter region, and comprises a well region located next to the first region, the first region is of a first conductivity type and the well region is of a second conductivity type, the well region is separated from the gate electrode by a gate insulator layer, the first region is electrically contacted by means of the first electrode, in the first region there is at least one current limiting region, and the at least one current limiting region is a sub-region of the first region with a decreased electrical conductivity.

11 Claims, 8 Drawing Sheets

(51) Int. Cl.
*H10D 62/13* (2025.01)
*H10D 62/832* (2025.01)

(52) U.S. Cl.
CPC ......... *H10D 12/481* (2025.01); *H10D 30/668* (2025.01); *H10D 62/8325* (2025.01)

(58) Field of Classification Search
CPC .... H10D 30/668; H10D 12/031; H10D 62/53; H10D 62/152
USPC .......................................................... 257/329
See application file for complete search history.

(56) References Cited

U.S. PATENT DOCUMENTS

| | | | | |
|---|---|---|---|---|
| 2015/0108564 | A1 | 4/2015 | Miura et al. | |
| 2017/0229535 | A1 | 8/2017 | Hatta et al. | |
| 2017/0243970 | A1 | 8/2017 | Losee et al. | |
| 2020/0286991 | A1 | 9/2020 | Basler et al. | |
| 2023/0369408 | A1* | 11/2023 | Bellini ................. | H10D 62/235 |

OTHER PUBLICATIONS

Alfieri et al., “Isothermal annealing study of the EH1 and EH3 levels in n-type 4H—SiC”, Journal of Physics Condensed Matter, Aug. 2020, 11 pages.
Bolotnikov et al., “Optimization of 1700V SiC MOSFET for short circuit ruggedness”, Materials Science Forum, ISSN 1662-9752, vol. 963, pp. 801-804, 2018, 4 pages.
Hatta et al., “Suppression of short-circuit current with embedded source resistance in SiC-MOSFET”, Materials Science Forum, ISSN: 1662-9760, vol. 924, pp. 727-730, 2018, 4 pages.
Huang et al., “Design and fabrication of 3.3kV SiC MOSFETs for industrial applications”, Proceedings of the 29th International Symposium on Power Semiconductor Devices & ICs, Sapporo, 2017, 4 pages.
IPEA European Patent Office, International Preliminary Report on Patentability, mailed Sep. 11, 2024, 52 pages.

* cited by examiner

SEMICONDUCTOR DEVICE AND MANUFACTURING METHOD

CROSS-REFERENCE TO RELATED APPLICATIONS

The present application is a national stage entry of International Patent Application No. PCT/EP2022/077321, filed on Sep. 30, 2022, the disclosures of which are hereby incorporated herein by reference as if set forth in full.

FIELD OF THE INVENTION

A semiconductor device is provided. A method for manufacturing such a semiconductor device is also provided.

BACKGROUND OF THE INVENTION

Documents US 2017/0243970 A1, US 2017/0229535 A1 and US 2015/0108564 A1 refer to semiconductor devices.

A problem to be solved is to provide a semiconductor device that has an improved trade-off between conduction losses and a short circuit withstand time, SCWT.

This object is achieved, inter alia, by a semiconductor device and by a method as defined in the independent patent claims. Exemplary further developments constitute the subject-matter of the dependent claims.

For example, the semiconductor device described herein comprises one or a plurality of current limiting regions which are sub-regions of a source region or emitter region, the sub-regions are irradiated so that there are more crystal lattice defects in the sub-regions than in remaining regions of the source region or the emitter region, and hence, the at least one current liming region has a reduced electrical conductivity compared with remaining regions of the source region or the emitter region. By means of the eat least one current limiting region, a source resistance value, $R_S$, is increased. This increase in $R_S$ does not significantly hamper the device performance in normal operation, but improves short circuit behavior.

According to at least one embodiment, the semiconductor device comprises a semiconductor body, a gate electrode and a first electrode. For example, the semiconductor body is of wide-bandgap semiconductor material like SiC, $Ga_2O_3$ or GaN.

However, the semiconductor body can alternatively be of silicon, Si for short. The electrodes can be made of at least one metal or also of a highly doped and/or of an ohmic conductive semiconductor material, like poly-Si.

According to at least one embodiment, the semiconductor body comprises a first region. For example, the first region is a source region or an emitter region.

According to at least one embodiment, the semiconductor body comprises a well region. The well region is located next to the first region. That is, the first region can touch the well region and can thus be in direct physical contact therewith. A channel region is part of the well region and may have the same doping concentration. During operation, electrons flow in the channel region from the source region to a drift region along a gate insulator layer. In operation of the semiconductor device, the channel region may be that part of the well region that is next to the gate insulator layer.

According to at least one embodiment, the first region is of a first conductivity type and the well region is of a different, second conductivity type. For example, the first conductivity type is n-conducting and the second conductivity type is p-conducting, or vice versa. In the following, the first conductivity type is referred to as n-conducting; thus, if the first conductivity type is p-conducting instead, the doping relationships described in the following have to be inverted.

According to at least one embodiment, the well region is adjacent to the gate electrode and is separated from the gate electrode by the gate insulator layer. The gate insulator layer can be directly between the gate electrode and the well region.

According to at least one embodiment, the first region is electrically contacted by means of the first electrode which is, for example, a source electrode or an emitter electrode. Hence, the first electrode can touch the semiconductor body at least at the first region. For example, the well is electrically contacted by means of the first electrode, too, or otherwise by a separate electrode.

According to at least one embodiment, in the first region there is one current limiting region or there is a plurality of current limiting regions. The at least one current limiting region is a sub-region of the first region with a decreased electrical conductivity. For example, the first region and the at least one current limiting region are of the same base material, like SiC. However, in the at least one current limiting region there are more defects in a crystal lattice than in other regions of the first region so that the electrical conductivity in the at least one current limiting region is intentionally lower than in the other regions of the first region.

In at least one embodiment, the semiconductor device comprises a semiconductor body, a gate electrode and a first electrode, wherein

- the semiconductor body comprises a first region and a well region located next to the first region, the first region is of a first conductivity type and the well region is of a different, second conductivity type,
- the well region is adjacent to the gate electrode and is separated from the gate electrode by a gate insulator layer,
- the first region is electrically contacted by means of the first electrode,
- in the first region there is at least one current limiting region, and
- at least one current limiting region is a sub-region of the first region with a decreased electrical conductivity.

Thus, this application describes, for example, a metal-insulator-semiconductor field-effect transistor, MISFET, a metal-oxide-semiconductor field-effect transistor, MOSFET, or a junction gate field-effect transistor, JFET, for example, based on the silicon carbide, SiC, material. At least one sub-region of the source region or emitter region is damaged by irradiation to reduce its electrical conductivity, to improve the trade-off between conduction losses and the short circuit withstand time.

SiC MOSFETs are currently available from several vendors. Offered with either planar or trench cell designs, SiC MOSFETs provide competitive static losses, fast dynamic performance and adequate reliability. Regarding the fault handling capability, SiC MOSFETs still fall short of the typical industry standard values of about 10 μs shown by their Si counterparts. This is typically associated with the strong trade-off between conduction losses and short-circuit withstand time, SCWT. One approach towards an optimum trade-off between the SCWT and a resistance of the device in the on-state, $R_{DS,on}$, is to use a slightly increased source resistance value, $R_S$.

Accordingly, herein, for example, a SiC MOSFET is described where part of the source region is subjected to an irradiation process. Provided the use of the appropriate mask, like a $SiO_2$ mask or an Al mask, irradiation of electrons, protons or neutrons in the $n^+$ source leads to the formation of defects that reduce the mobility and therefore increase the source resistance $R_S$, for example, resistivity can be changed to be the $10^{-2}$ to $10^7$ Ωcm range in the at least one current limiting region.

Hence, with the proposed at least one current limiting region, the current flows in a more resistive and/or constricted path. The effect leads to an increased value of the source resistance $R_S$. Increasing the value of $R_S$ will turn into a reduction of the saturation current $I_{SAT}$ during occurrence of a short circuit, SC for short. A depth of the irradiated region d and its length L could be properly designed to achieve the desired effect on the SC current, while keeping negligible its impact during conduction in nominal conditions, that is, on the total resistance between source and drain in the on state, also referred to as $R_{DS,on}$.

SUMMARY OF THE INVENTION

According to at least one embodiment, the semiconductor device is a power device. This means, for example, that the semiconductor device is configured for a maximum current through the well region of at least 10 A or of at least 50 A. As an option, the maximum current is at most 500 A or at most 1, 5 kA. Alternatively or additionally, the semiconductor device is configured for a maximum voltage of at least 0.6 kV or of at least 1.2 kV between source and drain or between emitter and collector. As an option, the maximum voltage may be at most 6.5 kV.

According to at least one embodiment, seen in top view of the semiconductor body, the gate electrode as well as the first electrode overlap with the first region. Here and in the following 'top view' may refer to a view perpendicular onto a top side of the semiconductor body on which the first electrode is applied and at which the first region is located.

According to at least one embodiment, the at least one current limiting region is distant from the gate electrode and/or from the first electrode, seen in top view of the semiconductor body. For example, the at least one current limiting region is distant from the gate electrode as well as from the first electrode, seen in top view.

According to at least one embodiment, the at least one current limiting region is located in the assigned first region in a mirror-symmetrical manner, for example, within the manufacturing tolerances. That is, seen in top view of the semiconductor body, the first region together with the at least one current limiting region has an axis of mirror symmetry, for example, concerning the shape of the first region and the at least one current limiting region. Said axis of mirror symmetry may run in parallel with the gate electrode and/or the first electrode and/or may be located between the gate electrode and the first electrode, seen in top view. Otherwise, non-mirror symmetric arrangements of the at least one current limiting region in the assigned first region, seen in top view, are also possible.

According to at least one embodiment, seen in top view of the semiconductor body, the first region completely extends between the at least one current limiting region and the first electrode as well as between the at least one current limiting region and the gate electrode. In other words, between the at least one current limiting region and the respective electrode, there is a part of the first region, for example, at the top side of the semiconductor body and seen in top view of the semiconductor body.

As an alternative, the at least one current limiting region may be covered in part by the gate electrode, or the at least one current limiting region touches the gate electrode, seen in view of the semiconductor body.

According to at least one embodiment, the at least one current limiting region is located between the first electrode and the gate electrode. For example, all of the at least one current limiting region is placed between said electrodes.

According to at least one embodiment, seen in cross-section of the semiconductor body, the first region extends all around the at least one current limiting region in directions towards the well region. This can mean that the first region is embedded in the well region and/or that the at least one current limiting region is embedded in the first region. For example, seen in cross-section, in this case there is part of the first region all around the at least one current limiting region so that there is no straight connection line within the semiconductor body from the at least one current limiting region to the well region without traversing the first region.

The term 'cross-section of the semiconductor body' may refer to a cross-section through the first region, through the current limiting region or through at least one of the current limiting regions, and through the gate electrode, for example, in a direction perpendicular to the top side of the semiconductor body and/or perpendicular to a direction of main extent of the gate electrode.

According to at least one embodiment, seen in cross-section of the semiconductor body, the at least one current limiting region is completely embedded in the first region. For example, seen in cross-section of the semiconductor body, the first region is all around the at least one current limiting region.

According to at least one embodiment, for example, seen in cross-section of the semiconductor body, the at least one current limiting region runs completely through the first region. Hence, the at least one current limiting region can be as deep as or deeper than the first region. In other words, the at least one current limiting region penetrates the first region in the direction perpendicular to the top side of the semiconductor body. The at least one current limiting region may start directly at the top side or may otherwise start distant from the top side within the first region.

According to at least one embodiment, a volume of the at least one current limiting region is at least 5% or is at least 10% or is at least 20% or is at least 40% or is at least 60% of an overall volume of the associated first region. Alternatively or additionally, said percentage is at most 95% or at most 85% or at most 75%. For example, said percentage is between 40% and 85% inclusive.

For example, due to the at least one current limiting region an electrical resistance through the first region between the first electrode and the channel region is increased by a factor of at least 1.1 or by a factor at least of 1.5 or by a factor of at least 2 or by a factor of at least 5. Alternatively or additionally, said factor is at most 100 or is at most 25 or is at most 15 or is at most 10 or is at most 5. For example, said factor is between 2 and 10 inclusive. The electrical resistance through the first region may refer to a normal operation current for which the semiconductor device is designed in an on-state. These factors refer to a comparison with a device having no at least one current limiting region in the first region, but otherwise being of identical construction, within the manufacturing tolerances.

According to at least one embodiment, an electrical conductivity of the at least one current limiting region is at least 0.1% or is at least 1% or is at least 5% of an electrical conductivity of remaining regions of the first region. Alternatively or additionally, said value is at most 95% or is at most 80% or is at most 20% or is at most 10%.

According to at least one embodiment, a crystal lattice in the at least one current limiting region has by at least a factor of two or by at least a factor of 5 or by at least a factor of 10 more defects than the remaining regions of the first region. Alternatively or additionally, said factor is at most $10^3$ or is at most 100 or is at most 10. Thus, in the at least one current limiting region there is a higher defect density than in the remaining regions of the first regions, achieved by irradiating the at least one current limiting region.

For example, by means of the at least one current limiting region, an effective cross-section for the flow of current within the first region from the first electrode to the well region next to the gate insulator layer, that is, to the channel region, is reduced by the at least one current limiting region by a factor of at least 1.5 or by a factor of at least 2 or by a factor of at least 5. Alternatively or additionally, said factor is at most 100 or is at most 15 or is at most 10 or is at most 5 or is at most 2. For example, said factor is between 2 and 10 inclusive.

The effective cross-section $A_{eff}$ for the flow of current may be a minimum of a local electrical resistance r integrated over an area A of a cross-section through the first region perpendicular to a main direction of current flow, $$A_{eff} = \min \int r dA.$$

According to at least one embodiment, the at least one current limiting region terminates aligned with the first region. Thus, across the first region and the at least one current limiting region the top side can be planar, and both the at least one current limiting region and the remaining regions of the first region terminate in the top side. In other words, the first region and the current limiting region form a flat face and terminate aligned with one another.

According to at least one embodiment, the semiconductor body further comprises a drift region. The drift region is of the first conductivity type, and, for example, has a lower maximum doping concentration compared with the first region and the well region.

According to at least one embodiment, the semiconductor body further comprises a second region. For example, the second region is a drain region or a collector region. In case of a drain region, the second region is of the first conductivity type, too, but, for example, with a maximum doping concentration higher than in the drift region. In case of a collector region, the second region is of the second conductivity type.

According to at least one embodiment, the drift region is located between the well region and the second region. Accordingly, the first region is separated from the second region by the well region.

According to at least one embodiment, the semiconductor device further comprises a second electrode which is a collector electrode or a drain electrode, for example. The second electrode can be located on a side of the second region remote from the drift region and/or remote from the first region.

According to at least one embodiment, seen in top view of the semiconductor body, the gate electrode and the first electrode each extend along a straight line. If there is a plurality of the first electrodes and/or of the gate electrodes, there can be a plurality of straight lines along which the first electrodes and/or the gate electrodes extend.

According to at least one embodiment, the first region extends in parallel with the gate electrode and/or the first electrode. Hence, the semiconductor device can be of a stripe design comprising a plurality of straight running stripes of the gate electrodes and/or the first electrodes.

According to at least one embodiment, seen in top view of the semiconductor body, the gate electrode and/or the first electrode each comprise a plurality of sub-sections. For example, the sub-sections correspond to unit cells. The unit cells can be arranged, for example, in a regular two-dimensional grid. The semiconductor body may extend continuously over all the unit cells and comprises an accordingly arranged plurality of the first regions. Hence, the semiconductor device can be of a cellular design comprising a plurality of cells each having a first electrode, a corresponding gate electrode as well as a corresponding first region with the at least one current limiting region.

According to at least one embodiment, the semiconductor device is of planar design. That is, the gate insulation layer and the gate electrode are applied on a planar section of the top side of the semiconductor body. The first region and the at least one current limiting region can be located at the top side.

According to at least one embodiment, the semiconductor device is of trench design. Hence, the gate insulation layer and the gate electrode are partly or completely arranged in a trench in the semiconductor body. For example, a depth of the trench exceeds a depth of the well region, starting from the top side of the semiconductor body. In this case, too, the first region and the at least one current limiting region can be located at the top side.

According to at least one embodiment, there is the exactly one current limiting region in the first region. In case of a plurality of first regions, there can be a one-to-one assignment between the first regions and the current limiting region.

Otherwise, there is a plurality of the current limiting regions in the first region. In case of a plurality of first regions, there can be a plurality of current limiting regions per first region. The current limiting regions of each one of the first regions, or of the exactly one first region, are distant from one another, seen in top view of the semiconductor body.

Seen in top view of the semiconductor body, the current limiting region or each one of the current limiting regions can completely be surrounded by the respectively assigned first region.

According to at least one embodiment, the current limiting regions are arranged along one stripe or along a plurality of stripes. Additionally, as an option, the current limiting regions are arranged along one row or along a plurality of rows, seen in top view, wherein the stripes and rows may be oriented perpendicular to one another. In case of a plurality of first regions, this can apply for each one of the first regions, wherein each one of the first regions is assigned to a plurality of the current limiting regions.

According to at least one embodiment, seen in top view of the semiconductor body, the current limiting regions are shaped as at least one of: triangle, square, rectangle, hexagon, circle. Seen in top view, all of the current limiting regions can be of the same shape and/or area content. Otherwise, also per first region, differently shaped and/or sized current limiting regions may be combined with each other.

A method for manufacturing the semiconductor device is additionally provided. By means of the method, a semiconductor device is produced as indicated in connection with at least one of the above-stated embodiments. Features of the semiconductor device are therefore also disclosed for the method and vice versa.

In at least one embodiment, the manufacturing method is for producing a semiconductor device, the method comprises, for example, in the stated order:

providing the semiconductor body, forming the first region and the well region in the semiconductor body, applying a mask layer on the semiconductor body, irradiating at least one portion of the first region defined by the mask layer with at least one of x-ray, electrons, protons, neutrons or ions so that the at least one current limiting region is created in the irradiated at least one portion, and applying the gate insulator layer as well as the gate electrode and the first electrode to the semiconductor body.

A dose for irradiating the at least one portion can be used as a design parameter to tune the resistance of the at least one current limiting region and, thus, of the first region and to achieve the desired effect. For example, in case of electron irradiation the dose could range between $10^{10}$ $cm^{-2}$ and $10^{17}$ $cm^{-2}$ and/or up to 10% of a maximum doping concentration of the first region. For proton irradiation, for example, the dose can be between $10^{8}$ $cm^{-2}$ and $10^{14}$ $cm^{-2}$.

The shape of the at least one current limiting region, seen in top view of the top side, is defined by the mask layer, while a depth of the at least one current limiting region depends on a mask layer thickness and an energy used for irradiation, for example, from a minimum of 116 keV for electrons or from a minimum of 200 keV for protons and neutrons. It is possible that there is only one kind of irradiation, for example, only electron radiation, or different kinds of radiations can be combined with each other.

According to at least one embodiment, the method further comprises forming at least one plug region into the semiconductor body. The at least one plug region is of the second conductivity type and has a maximum doping concentration higher than a maximum doping concentration of the well region. The at least one plug region is for electrically contacting the well region, for example, by means of the first electrode.

According to at least one embodiment, the first region reaches deeper into the semiconductor body than the at least one plug region.

According to at least one embodiment, creating the first region includes two different doping steps so that, seen in cross-section, a doping profile of the first region is of a stepped manner. That is, the first region can widen towards the top side.

A semiconductor device and a method described herein are explained in greater detail below by way of exemplary embodiments with reference to the drawings. Elements which are the same in the individual figures are indicated with the same reference numerals. The relationships between the elements are not shown to scale, however, but rather individual elements may be shown exaggeratedly large to assist in understanding.

DETAILED DESCRIPTION OF THE INVENTION

Figure 1:
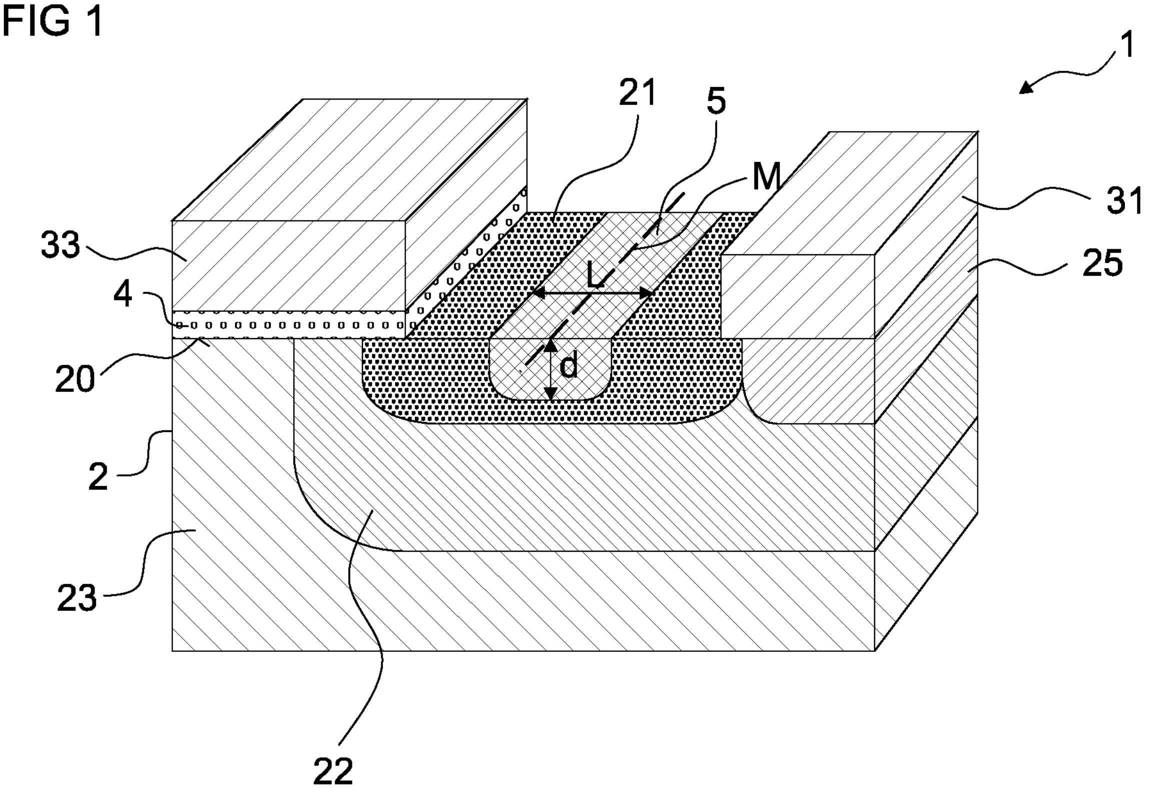
FIG. 1 is a schematic perspective sectional view of an exemplary embodiment of a semiconductor device described herein.

FIG. 1 illustrate an exemplary embodiment of a semiconductor device 1. The semiconductor device 1 comprises a semiconductor body 2 which is, for example, of SiC. In the semiconductor body 2, there is a first region 21, a well region 22 and a drift region 23. Further, there is a plug region 25 for electrically contacting the well region 22.

Further, the semiconductor device 1 comprises a gate electrode 33 which is separated from the semiconductor body 2 by means of a gate insulator layer 4. Further, there is a first electrode 31 which electrically contacts the first region 21 and the plug region 25. The gate insulator layer 4 and the first electrode 31 are located at a top side 20 of the semiconductor body 2. The top side 20 is of planar fashion. The gate electrode 33 and the first electrode 31 may each extend along a straight line along a direction perpendicular to the cross-section illustrated in FIG. 1.

The gate insulator layer 4 may be of a metal oxide, a semiconductor oxide, a metal nitride and/or a semiconductor nitride. For example, the a gate insulator layer 4 includes one or a plurality of the following materials: $SiO_2$, $Si_3N_4$, $Al_2O_3$, $Y_2O_3$, $ZrO_2$, $HfO_2$, $La_2O_3$, $Ta_2O_5$, $TiO_2$.

For example, the first region 21 and the drift region 23 are n-doped and the well region 22 and the plug region 25 are p-doped. If the semiconductor device 1 is an insulated-gate bipolar transistor, IGBT or a reverse-conducting insulated-gate bipolar transistor, RC-IGBT, then the first region 21 is an emitter region and the first electrode 31 is an emitter electrode. If the semiconductor device 1 is a junction gate field-effect transistor, JFET, a metal-insulator-semiconductor field-effect transistor, MISFET, or a metal-oxide-semiconductor field-effect transistor, MOSFET, then the first region 21 is a source region and the first electrode 31 is a source electrode.

In the first region 21, there is a current limiting region 5. The current limiting region 5 is of the same material as the rest of the first region, for example, of SiC. However, due to irradiating the part of the first region 21 that constitutes the current limiting region 5, in the current limiting region 5 the electrical conductivity is decreased, compared with the rest of the first region 21.

Thus, FIG. 1 depicts the basic concept of the proposed semiconductor device 1. A region, that is, the at least one current limiting region 5, is irradiated after source activation. Its width is defined by a mask design, while the depth of this region 5 depends on a mask thickness and the energy used for irradiation. During irradiation, for example, several point defects are formed. These defects can form electrically active levels in the band gap, like EH1, Z1/2, EH3, EH4, EH5 and EH6/7, compare G. Alfieri et al., "Annealing behavior between room temperature and 2000° C. of deep level defects in electron-irradiated n-type 4H silicon carbide", Journal of Applied Physics 98, 043518 (2005), doi: 10.1063/1.2009816, and Alfieri et al., "Isothermal Annealing Study of the EH1 and EH3 Levels in n-type 4H-SiC", J. Phys.: Condens. Matter 32, 4657'3 (2020), doi: 10.1088/1361-648X/abaeaf. These levels trap charge carriers and decrease the mobility. The lower mobility increases the value of the source resistance $R_S$.

The current limiting region 5 runs along a straight line in parallel with the gate electrode 33 and the first electrode 31. The current limiting region 5 is located directly at the top side 20, like the first region 21. A depth of the first region 21 into the semiconductor body 2 exceeds a depth of the current limiting region 5 into the semiconductor body 2, starting from the top side 20. Towards the well region 22 in which the first region 21 is embedded, all around the current limiting region 5 there is the first region 21, seen in cross-section.

For example, the at least one current limiting region 5 is arranged mirror symmetrically in the first region 21, seen in top view as well as seen in cross-section. For example, seen in top view of the top side 20, the current limiting region 5 is arranged symmetrically in the first region 21 and between the electrodes 31, 33. Hence, there can be a line M of mirror symmetry concerning the current limiting region 5 and the first region 21.

The at least one current limiting region 5 can have different shapes and depths and can be uniform or also non-uniform along the direction perpendicular to the cross-section of FIG. 1, see also FIGS. 2 to 9 below.

With the proposed at least one current limiting region 5, the current flows in a more resistive and/or constricted path. This effect leads to an increased value of the source resistance $R_S$ or correspondingly of an emitter resistance. Increasing the value of $R_S$ will turn into a reduction of the saturation current $I_{SAT}$, during a short circuit condition. A depth d of the current limiting region 5 and its length L in parallel with the top side 20 and along the cross-section of FIG. 1 could be properly designed to achieve the desired effect on the short circuit current, while keeping negligible its impact during conduction in nominal conditions, for example, on the total $R_{DS,on}$.

For example, the carriers' effective channel-to-contact path length Leff is a minimum of a local resistance r along all possible routes S with incremental elements s within the first region 21, including the at least one current limiting region 5, $L_{eff}=\min \int_s r ds$.

Figure 2:
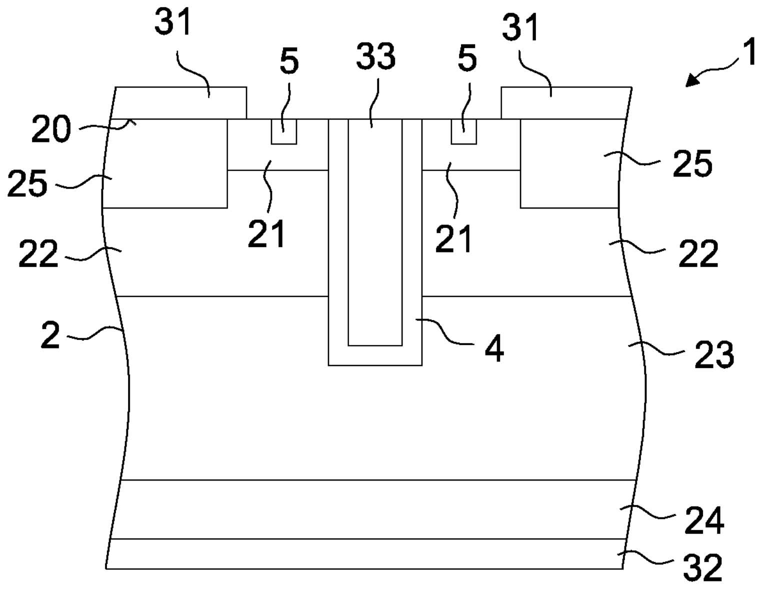
FIGS. 2 to 4 are schematic sectional views of exemplary embodiments of semiconductor devices described herein.

The semiconductor device 1 of FIG. 1 is of a planar design. Contrary to that, the semiconductor device 1 of FIG. 2 is of a trench design. Thus, the gate electrode 33 and the gate insulator layer 4 are at least partially located in a trench into the semiconductor body 2. Accordingly, the top side 20 is not of planar fashion as it is penetrated by said trench, contrary to what is the case in FIG. 1. The gate electrode 33 reaches deeper into the semiconductor body 2 than the well region 22, for example, starting from the top side 20.

Further, in FIG. 2 it is shown that there are multiple first regions 21 and, thus, current limiting regions 5, arranged, for example, symmetrically with respect to the gate electrode 33. There can be a plurality of the units illustrated in FIG. 2 next to one another along a direction in parallel with the top side 20 so that there can be a plurality of stipes of the gate electrode 33 as well as of the first electrode 31 running perpendicular to the plane of projection of FIG. 2 and running in parallel with each other.

Figure 14:
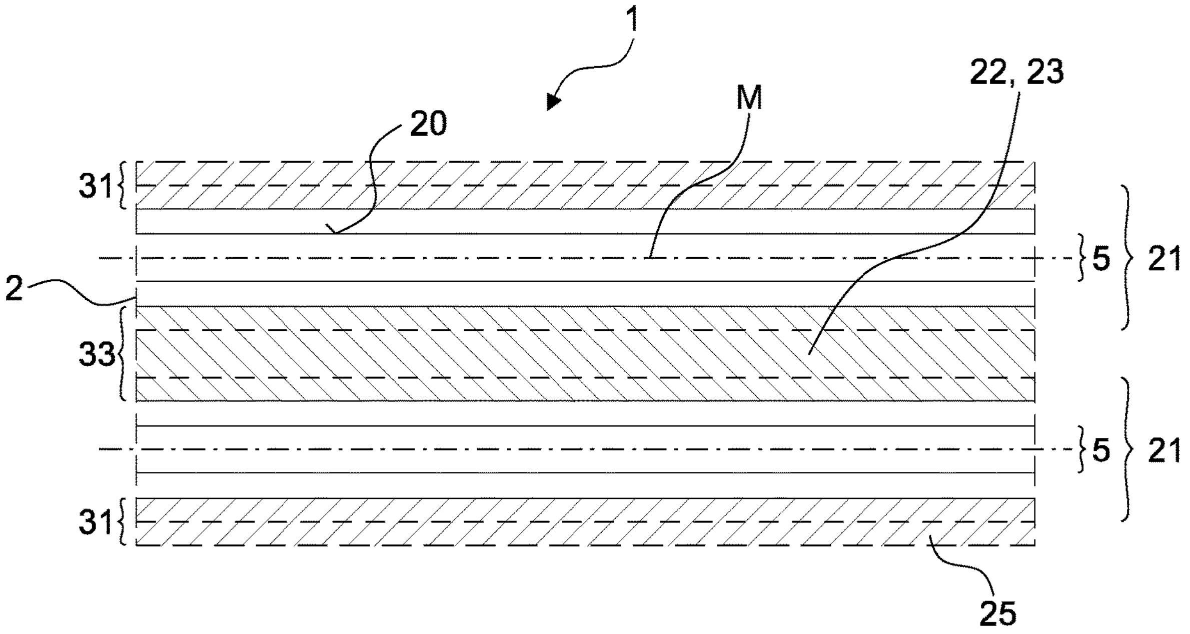
FIGS. 14 and 15 are schematic top views of exemplary embodiments of semiconductor devices described herein.

This symmetric arrangement of FIG. 2, see also FIG. 14, and/or the trench design of FIG. 2 can be applied analogously to all other embodiments, too.

The current limiting regions 5, one per first region 21, of FIG. 2 are of the same design as in FIG. 1, that is, of a trough with cuboid shape. According to FIG. 2, the trough has sharp edges and corners; according to FIG. 1, the trough has rounded edges and corners. Both designs are possible in all embodiments, depending on the manufacturing process of the at least one current limiting region 5.

Moreover, in FIG. 2 it is shown that there is a second electrode 32, and the semiconductor body 2 comprises a second region 24. For example, the second region 24 is a substrate on which the other regions 23, 22, 21, 25 are formed by means of growth and/or doping, like ion implantation. In case of an IGBT or RC-IGBT, the second electrode 32 is a collector electrode, and the second region is a collector region which is of the same doping type as the well region. In case of a MOSFET or MISFET, the second electrode 32 is a drain electrode, and the second region is a drain region which is of the same doping type as the first region. The same applies for all other embodiments of the semiconductor device 1.

Further, according to FIG. 2 the plug region 25 reaches deeper into the semiconductor body 2, starting from the top side 20, than the first region 21. Otherwise, see FIG. 1, the plug region 25 can have the same depth as the first region 21 or can also be shallower or deeper than the first region 21. Both possibilities can apply in all the embodiments.

As in FIG. 1, also in FIG. 2 the at least one current limiting region 5 per first region 21 is distant from the first electrode 31, from the gate electrode 33 and from the gate insulator layer 4.

For example, maximum doping concentrations of the first region 21, the second region 24 and the at least one plug region 25 are at least $1\times10^{18}$ $cm^{-3}$ or are at least $5\times10^{18}$ $cm^{-3}$ or at least $1\times10^{19}$ $cm^{-3}$ and/or at most $5\times10^{20}$ $cm^{-3}$ or at most $2\times10^{20}$ $cm^{-3}$ or at most $1\times10^{20}$ $cm^{-3}$. Further, a maximum doping concentration of the well region 22 and, thus, of a channel region next to the gate insulator layer 4 may be at least $5\times10^{16}$ $cm^{-3}$ or at least $1\times10^{17}$ $cm^{-3}$ and/or at most $5\times10^{19}$ $cm^{-3}$ or at most $5\times10^{18}$ $cm^{-3}$. Depending on the voltage class of the semiconductor device 1, a maximum doping concentration of the drift region 23 may be at least $1\times10^{11}$ $cm^{-3}$ or at least $1\times10^{12}$ $cm^{-3}$ or at least $1\times10^{13}$ $cm^{-3}$ and/or at most $1\times10^{17}$ $cm^{-3}$ or at most $5\times10^{16}$ $cm^{-3}$ or at most $1\times10^{16}$ $cm^{-3}$. For example, a thickness of the gate insulator layer 4 is between 10 nm and 250 nm or between 80 nm and 150 nm. These parameters may individually or collectively apply for all other embodiments, too.

Otherwise, the same as to FIG. 1 may also apply to FIG. 2, and vice versa.

Figure 3:
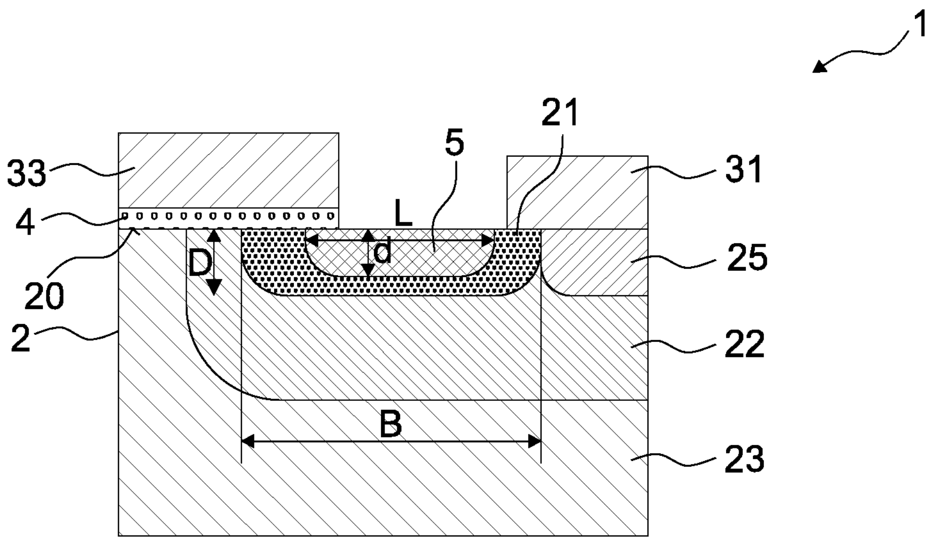
Figure 4:
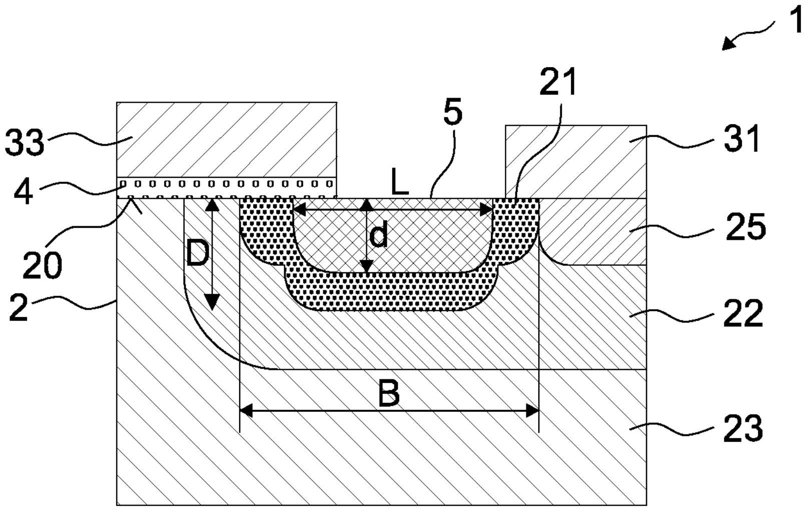

In FIGS. 3 and 4, like in FIG. 1, there is one current limiting region 5 per first region 21. The current limiting region 5 can be arranged mirror symmetrically in the first region 25, the axis of mirror symmetry runs perpendicular to the top side 20.

Contrary to what is shown in FIG. 1, according to FIGS. 3 and 4 the current limiting region 5 extends beyond the gate insulator layer 4 as well as the gate electrode 33. Such an arrangement is possible in all other embodiments, too. Otherwise, contrary to what is shown in FIGS. 3 and 4, the current limiting region 5 may be located non-mirror symmetrically in the first region 21 so that the current limiting region 5 ends distant from the gate insulator layer 4 and, thus, may not run beyond the gate electrode 33. This is possible as well in all other embodiments.

According to FIG. 3, the current limiting region 5 is formed as a shallow trough in the first region 21 which is also formed as one trough. The depth d of the current limiting region 5 amounts, for example, between 10% and 90% or between 40% and 80% of a depth D of the first region 21. The first region 21 and the plug region 25 may be of the same depth, for example, within manufacturing tolerances. For example, the depth D of the first region 21 is at least 0.1 μm and/or is at most 2 μm.

According to FIG. 4, the current limiting region 5 is formed as a deep trough in the first region 21 which is formed as two troughs, one above the other, wherein the trough next to the top side 20 has a larger extent in parallel with the plane of projection of FIG. 4. In this case, too, the depth d of the current limiting region 5 can amount between 10% and 90% or between 40% and 80% of the depth D of the overall first region 21. Because of the design with two stacked troughs, the first region 21 can run deeper into the semiconductor body 2 than the plug region 25. It is possible that the plug region 25 is of the same depth as the trough of the first region 21 next to the top side 20, for example, within manufacturing tolerances. For example, the depth D of the first region 21 is at least 2 μm and/or is at most 4 μm.

For example, first the trough next to the top side 20 is formed by corresponding doping, and then the doping for the trough remote from the top side 20 is provided, for example, by using a different energy in an ion implantation step. Hence, the trough of FIG. 4 has a step-like design, seen in cross-section. Otherwise, a deep trough with the rectangular shape with rounded corners, for example, as depicted in FIG. 3, is likewise possible in the configuration of FIG. 4.

Both designs with a shallow or a deep first region 21 as shown in FIGS. 3 and 4 are possible in all other embodiments, too.

For example, the length L of the current limiting region 5 is between 10% and 90% or between 40% and 80% or between 50% and 70% of a width B of the first region 21. This is possible as well in all other embodiments.

Otherwise, the same as to FIGS. 1 and 2 may also apply to FIGS. 3 and 4, and vice versa.

Figure 5:
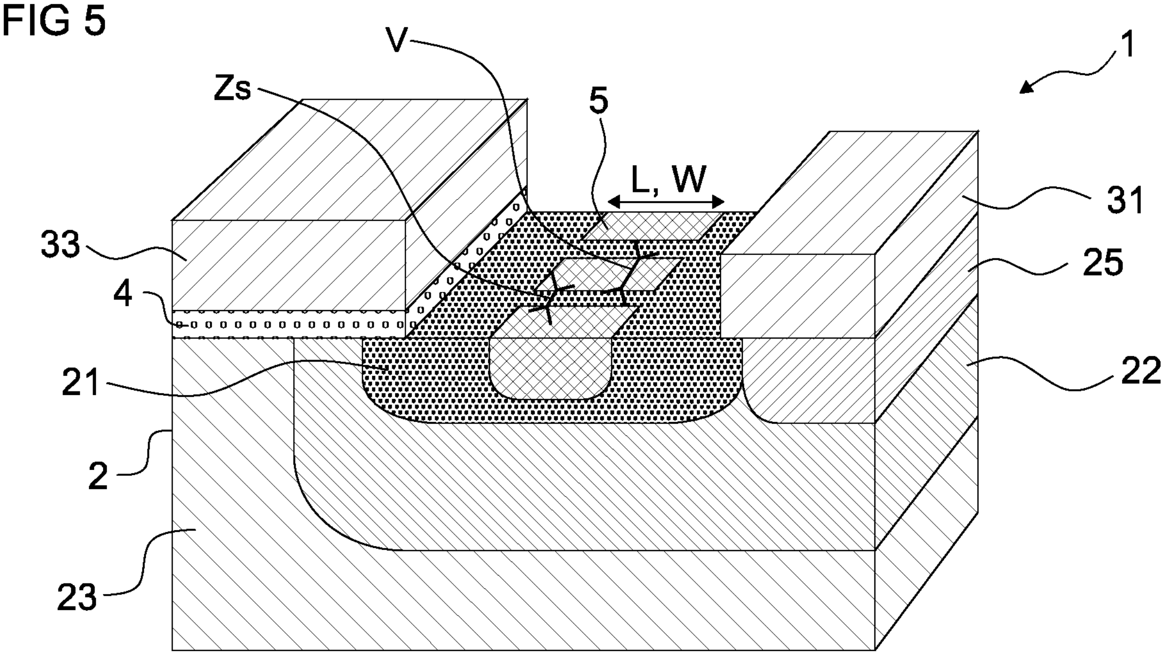
FIGS. 5 and 6 are schematic perspective sectional views of exemplary embodiments of semiconductor devices described herein.
Figure 6:
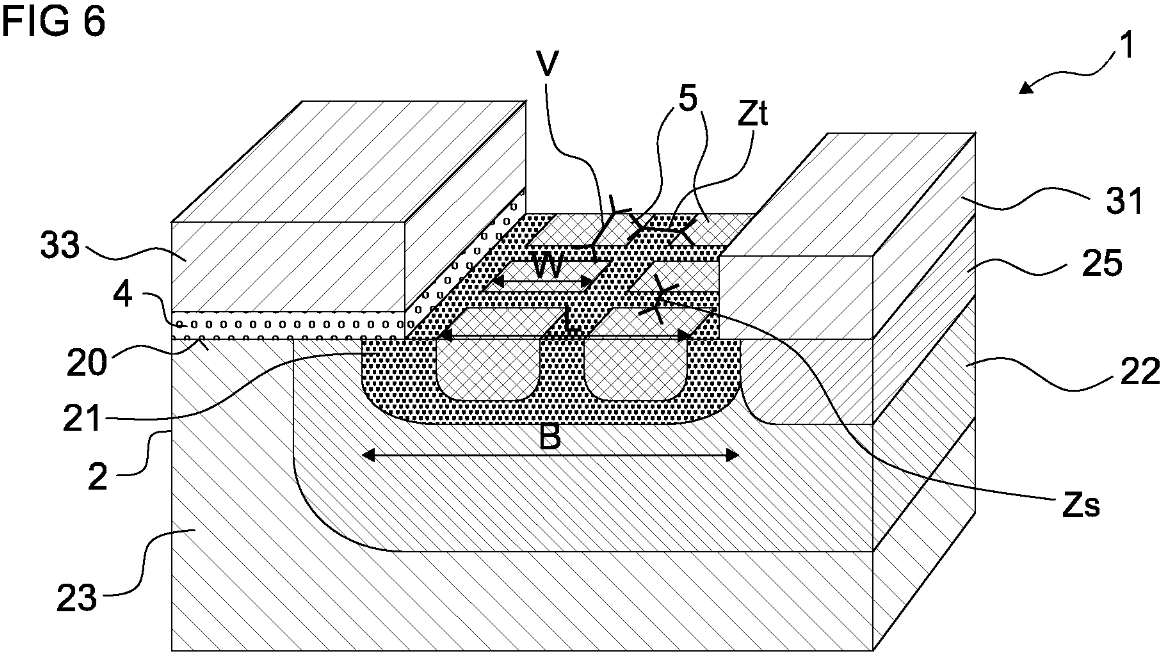
Figure 7:
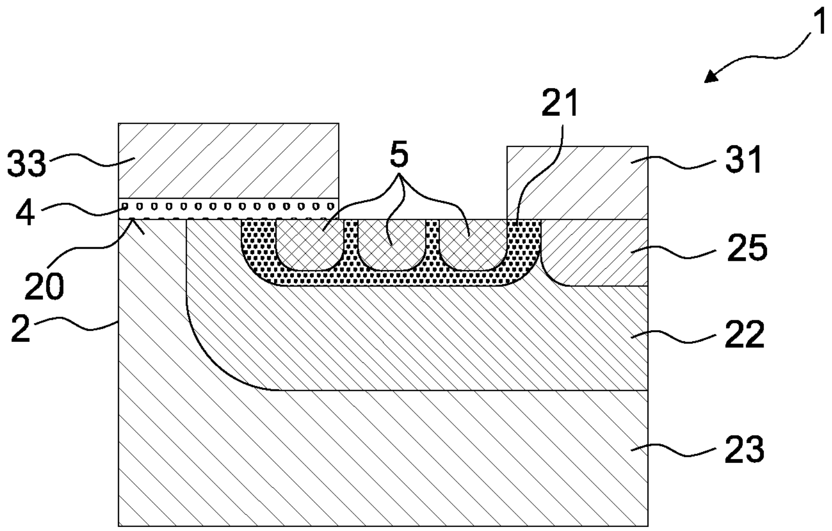
FIGS. 7 to 9 are schematic sectional views of exemplary embodiments of semiconductor devices described herein.

According to FIGS. 5 to 7, there are multiple current limiting regions 5 per first region 21. Concerning the parameters d, D, B, L as stated above for the case of a single current limiting region 5 per first region 21, the same applies for the case for multiple current limiting regions 5 per first region 21, wherein L corresponds to an overall width of all the respective current limiting regions 5, compare, for example, FIG. 6. By means of the plurality of current limiting regions 5, there are more design parameters to achieve an optimized first region.

In case of one current limiting region 5 in the direction perpendicular to the gate electrode 33 and/or the first electrode 31, see FIG. 5, the overall width L is the same as a width W of an individual, insular current limiting region 5 as illustrated in FIG. 4.

However, according to FIG. 5 there is one stripe of current limiting regions 5 extending in parallel with the electrodes 31, 33. Seen in top view, the current limiting regions 5 are of rectangular or square shape, optionally with rounded corners, each having the width W and a length extent V. For example, V is between 0.5 L and 100 L or is between 0.5 L and 10 L or is between 0.7 L and 5 L.

For example, a distance Zs between adjacent current limiting regions 5 along the stripe is between 10% and 75% or between 10% and 40% of the width W and/or of the length extent V. The individual current limiting regions 5 in the stripe can be arranged in an equidistant manner or, other than shown in FIG. 5, with varying distances to one another. These aspects may also apply for all other embodiments, individually or collectively.

Other than shown, the current limiting regions 5 need not be of square shape, seen in top view, but can also be of rectangular, hexagonal, regular or irregular polygonal or circular shape, seen in top view. The same applies for all other embodiments.

According to FIGS. 5 to 7, all the current limiting regions 5 per first region 21 are of the same shape. This is not absolutely necessary. That is, differently shaped current limiting regions 5 may be combined within one first region 21.

There can be N stripes of the current limiting regions 5 between the electrodes 31, 33, where N is a natural number larger than or equal to two. For example, N is at most ten or is at most four. According to the example of FIG. 6, N is two. For example, it applies that $0.1\ B/N \leq W \leq 0.99\ B/N$ or $0.4\ B/N \leq W \leq 0.95\ B/N$ or $0.7\ B/N \leq W \leq 0.90\ B/N$. Alternatively, or additionally, for example, a distance Zt between adjacent current limiting regions 5 in a traverse direction perpendicular to the stripes is between 10% and 75% or between 10% and 40% of the length extent V. Alternatively, or additionally, for example, it applies that $0.1\ B/N \leq V \leq 100\ B/N$ or $0.4\ B/N \leq V \leq 10\ B/N$ or $0.7\ B/N \leq V \leq 5\ B/N$. The current limiting regions 5 can be arranged in an equidistant manner in parallel as well as perpendicular to the electrodes 31, 33.

As shown in FIG. 6, all the N stripes have the same number of current limiting regions 5 so that there are in each case K current limiting regions 5 next to one another in a direction in parallel with the stripes. Consequently, a regular array of N×K current limiting regions 5 is formed, and all the current limiting regions 5 are of the same shape.

However, this is not necessary. That is, current limiting regions 5 of different shapes and sizes can be combined with each other, and there can be different numbers K of current limiting regions 5 per stripe and/or different numbers N of current limiting regions 5 in the direction in parallel with the width L. For example, there are current limiting regions 5 of different widths W so that there may be rows in parallel with the direction along the width L having a single broad current limiting region 5 and alternating with rows having a plurality of narrower current limiting regions 5, by way of example.

In FIG. 7 it is illustrated that N is three. As an option, the stripe most distant from the first electrode 31 reaches beyond the gate insulator layer 4. However, other than shown in FIG. 7, all the stripes can be distant from the gate electrode 33, for example, seen in top view of the top side 20.

Each one of the stripes of FIG. 7 can be composed of multiple current limiting regions 5, as in FIGS. 5 and 6, or there is only a single current limiting region 5 per stripe, as in FIGS. 1 to 4. The same applies for all other embodiments.

The current limiting regions 5 of FIGS. 5 to 7 are of shallow design, compare, for example, FIG. 3 above. It is also possible that all or some of the current limiting regions 5 per first region 21 are of the deep design as depicted in context with FIG. 4.

Otherwise, the same as to FIGS. 1 to 4 may also apply to FIGS. 5 to 7, and vice versa.

Figure 8:
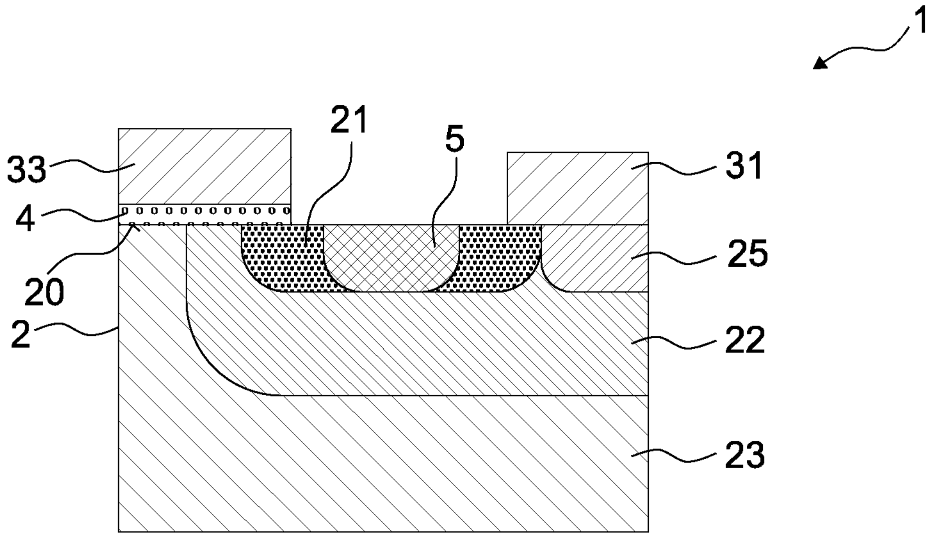

In the semiconductor device 1 of FIG. 8 the current limiting region 5 completely runs through the first region 21 from the top side 20 to the well region 22. Hence, all current from the first electrode 31 to the channel region of the well region 22 next to the gate insulator layer 4 has to flow through the current limiting region 5 of lower electric conductivity, disregarding possible minor currents around the current limiting region 5 through the part of the well region 22 on a side of the current limiting region 5 remote from the top side 20.

By means of the length in parallel with the plane of projection of FIG. 8 and by means of the electrical conductivity of the current limiting region 5, the resistance of the first region 21 can particularly precisely be adjusted.

Otherwise, the same as to FIGS. 1 to 7 may also apply to FIG. 8, and vice versa.

Figure 9:
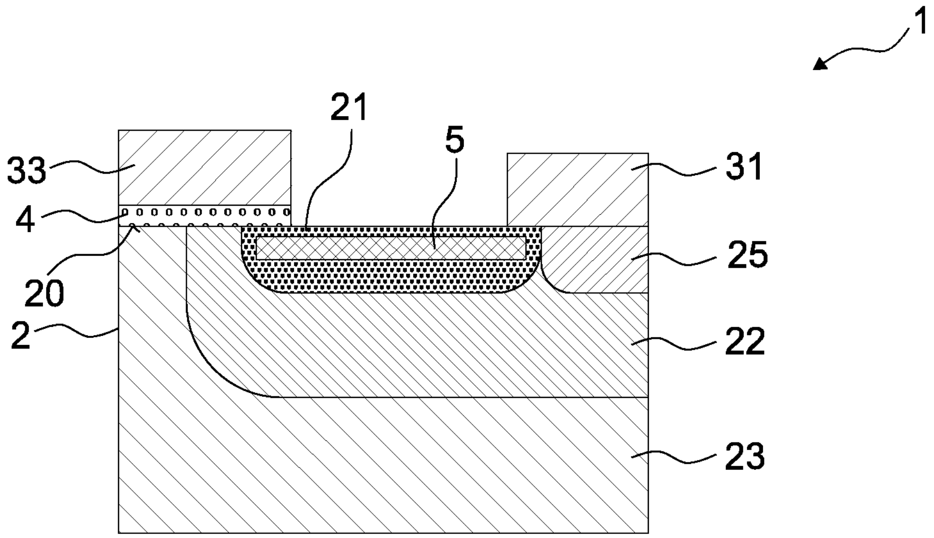

In the semiconductor device 1 of FIG. 9, the current limiting region 5 is completely embedded in the rest of the first region 21. That is, the first region 21 is all around the current limiting region 5. Accordingly, it is possible that the current limiting region 5 extends beyond the gate electrode 33. Other than shown, the current limiting region 5 may not extend below the gate electrode 33.

For example, a layer thickness of the first region 21 all around the current limiting region 5 has a thickness of at least 5% or of at least 10% and/or of at most 30% or of at most 45% of an overall thickness of the first region 21 together with the embedded current limiting region 5.

The design of FIG. 9 is also possible with a plurality of the current limiting regions 5 per first region 21, compare, for example, FIGS. 5 to 7, or also with a deep current limiting region 5, compare, for example, FIG. 4.

Otherwise, the same as to FIGS. 1 to 8 may also apply to FIG. 9, and vice versa.

Figure 10:
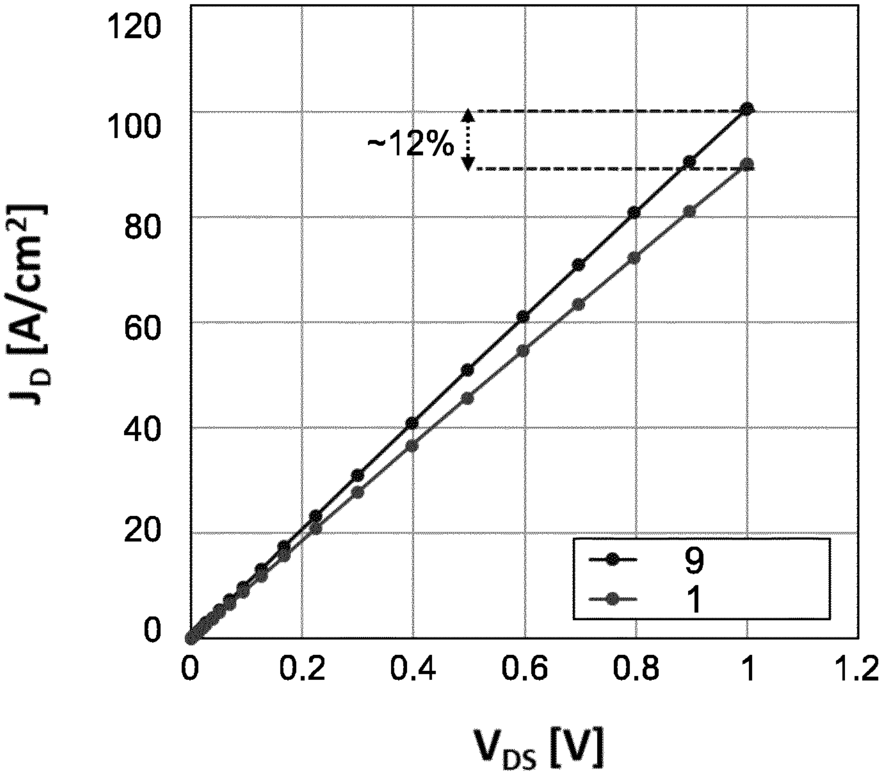
FIGS. 10 and 11 are schematic diagrams of electric characteristics of simulations of an exemplary embodiment of a semiconductor device described herein, compared with corresponding semiconductor device free of the at least one current limiting region.
Figure 11:
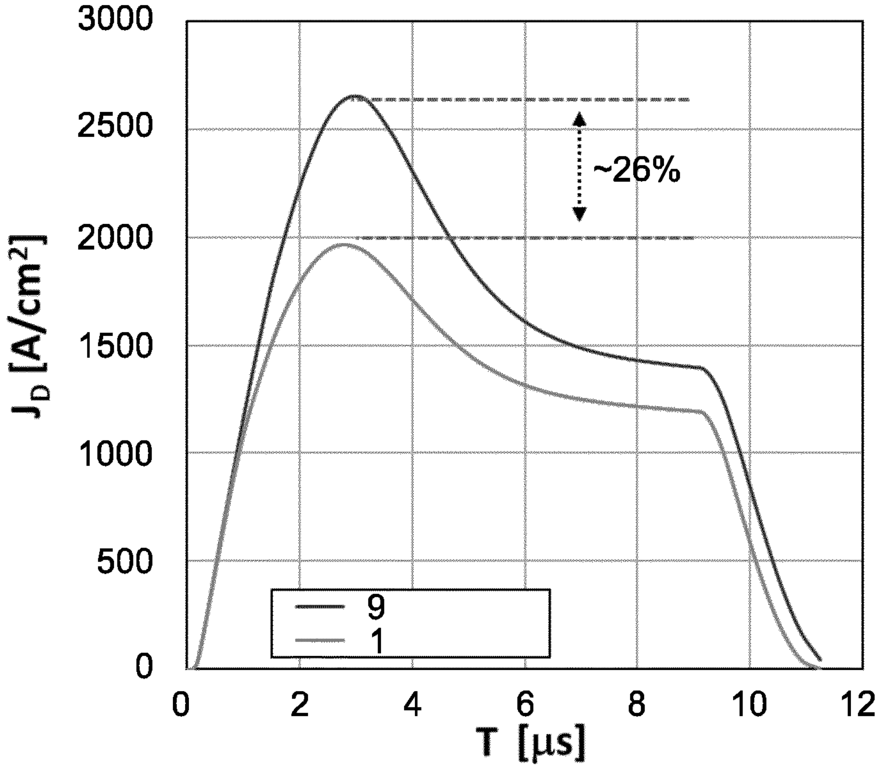

FIGS. 10 and 11 show a simulated isothermal output $J_D$ vs. $V_{DS}$ at a gate-source voltage $V_{GS}$=15 V and at a temperature of 300 K, and the electrothermal short-circuit waveforms at a drain-source voltage $V_{DS}$=600 V and at $V_{GS,Swing}$=−5 V/+15V for the semiconductor device 1 of FIG. 8, compared to a corresponding reference MOSFET design 9 without any current limiting region. In the semiconductor device 1 corresponding to FIG. 8, the quotient d/D of the depth d of the current limiting region 5 and the depth D of the first region 21 is 1. The quotient L/B of the length L of the current limiting region 5 and the width B of the first region 21 is 0.5.

It can be noted that the achieved reduction of a maximum saturation current $I_{SAT,peak}$ during short-circuit is larger than the increase of the resistance in the on-state, $R_{DS,on}$. Since the energy the device is subjected to during short circuit is directly related to the maximum value of $I_{SAT}$, the semiconductor devices 1 described herein improve the short-circuit withstanding time without significantly affecting the conduction losses.

Figure 12:
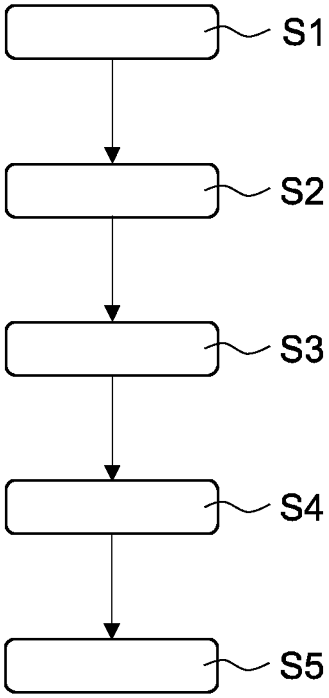
FIG. 12 is a schematic block diagram of an exemplary embodiment of a method for manufacturing semiconductor devices described herein.

In FIG. 12, a method for producing the semiconductor devices 1 is illustrated. In a method step S1, the semiconductor body 2 is provided. For example, the semiconductor body 2 provides the drift region 23. Then, in a method step S2, the first region 21 and the well region 22 are formed in the semiconductor body 2 as well as the plug region 25.

Next, in step S3 at least one mask layer is provided on the top side 20 of the semiconductor body 2. Further, see step S4, at least one portion of the first region 21 defined by the mask layer is irradiated with at least one of x-ray, electrons, protons, neutrons or ions so that the at least one current limiting region 5 is created in the at least one irradiated portion. Then, in step S5, the gate insulator layer 4, the gate electrode 33 and the first electrode 31 are applied to the semiconductor body 2, and optionally the second electrode 32 as well.

In another step, not illustrated, the mask layer may partially or completely be removed, and the semiconductor device 1 may be finished.

The method steps S1 to S5 may not necessarily be performed in the stated order.

Figure 13:
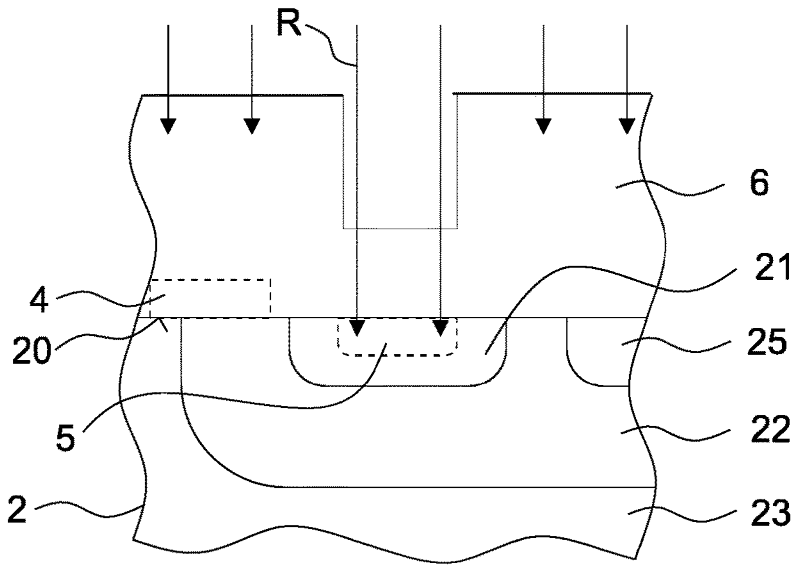
FIG. 13 is a schematic sectional view of a method step of an exemplary embodiment of a method described herein.

In FIG. 13, method step S5 is illustrated in more detail. As can be seen from FIG. 13, in this step S5 optionally the electrodes have not yet been applied. It is also possible that the gate insulator layer 4 is applied just after the irradiation step, symbolized in FIG. 13 by having the gate insulator layer 4 represented by a dashed line.

Hence, according to FIG. 13 the mask layer 6, which is, for example, of silicon dioxide, is applied on the top side 20 and is structured to represent the at least one current limiting region 5. In the area of the at least one current limiting region 5, the radiation R can reach the first region 21 through the mask layer 6. In other parts of the semiconductor body 2, it is possible that the radiation R cannot reach the semiconductor body 2.

Contrary to what is shown in FIG. 13, it is also possible to have the top side 20 completely free of the mask layer 6 in the area of the at least one current limiting region 5.

For example, the radiation R is composed of electrons, protons or neutrons with energies above about 0.1 MeV. With such a radiation, the crystal lattice of the material of the first region 21 can be damaged so that an increased number of point defects arise. Other than inflicting an increased defect density, it may alternatively or additionally be possible to neutralize the doping of the first region 21 by counter-doping, for example, so that the radiation R can also be composed of ions.

In FIG. 14 an example of the semiconductor device 1 is shown in top view. It can be seen that the stripe of the gate electrode 33 is located, for example, in a symmetric manner, between two stripes of a half of the first electrode 31 and, thus, between two stripes of the first region 21 having the current limiting region 5. The structure in FIG. 14 corresponds to a unit cell which can be multiplied so that a plurality of the unit cells can be arranged next to one another.

This stripe design can also be applied to the embodiments of FIGS. 1 and 3 to 9 analogously; in FIG. 2, this kind of symmetric design is already shown.

Otherwise, the same as to FIGS. 1 to 13 may also apply to FIG. 14, and vice versa.

Figure 15:
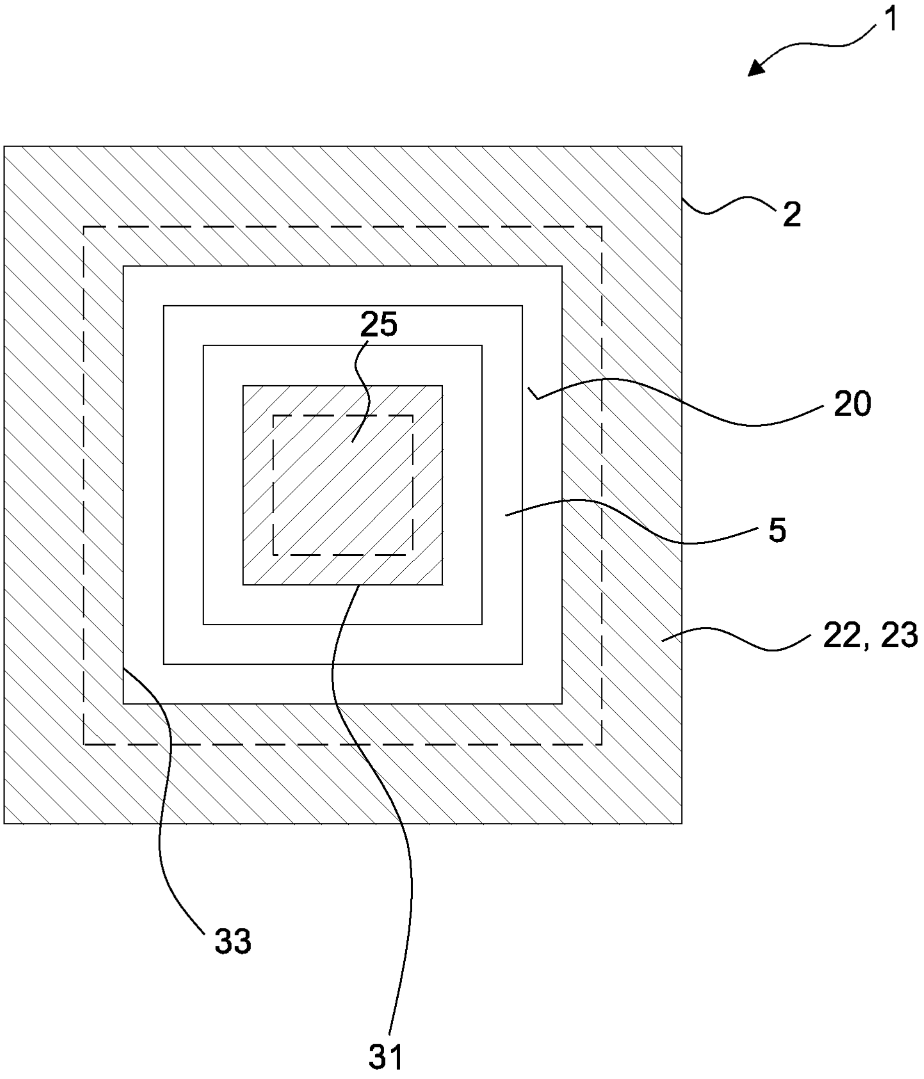

Further, see FIG. 15, the semiconductor device 1 can also be of a cellular design, seen in top view, so that a rectangular or square unit cell can arise. For example, in the centre of the unit cell there is the first electrode 31 which is surrounded by the gate electrode 33 in a frame-like manner. Such unit cells can be arranged two-dimensionally so that the semiconductor device 1 can comprise a large number of such unit cells.

Otherwise, the same as to FIG. 14 may also apply to FIG. 15, and vice versa.

The components shown in the figures follow, unless indicated otherwise, exemplarily in the specified sequence directly one on top of the other. Components which are not in contact in the figures are exemplarily spaced apart from one another. If lines are drawn parallel to one another, the corresponding surfaces may be oriented in parallel with one another. Likewise, unless indicated otherwise, the positions of the drawn components relative to one another are correctly reproduced in the figures.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. A semiconductor device comprising a semiconductor body, a gate electrode and a first electrode, wherein the semiconductor body comprises a first region which is a source region or an emitter region, and comprises a well region located next to the first region, the first region is of a first conductivity type and the well region is of a different, second conductivity type, the well region is adjacent to the gate electrode and is separated from the gate electrode by a gate insulator layer, the first region is electrically contacted by means of the first electrode which is a source electrode or an emitter electrode, in the first region there is at least one current limiting region, the at least one current limiting region is a sub-region of the first region with a decreased electrical conductivity, and the semiconductor device is of planar design so that the gate insulation layer and the gate electrode are applied on a planar section of a top side of the semiconductor body, the first region is located at the top side, and wherein either, seen in cross-section of the semiconductor body through the first region and through the gate electrode, the first region extends all around the at least one current limiting region in directions towards the well region so that the first region is embedded in the well region and so that the at least one current limiting region is embedded in the first region, or the at least one current limiting region is completely embedded in the first region so that, seen in cross-section of the semiconductor body, the first region is all around the at least one current limiting region.

2. The semiconductor device according to claim 1, wherein, seen in top view of the semiconductor body, the gate electrode as well as the first electrode overlap with the first region, and the at least one current limiting region is distant from the gate electrode as well as from the first electrode.

3. The semiconductor device according to claim 1, wherein, seen in top view of the semiconductor body, the first region completely extends between the at least one current limiting region and the first electrode as well as between the at least one current limiting region and the gate electrode, the at least one current limiting region is located between the first electrode and the gate electrode.

4. The semiconductor device according to claim 1, wherein the at least one current limiting region is completely embedded in the first region so that, seen in cross-section of the semiconductor body, the first region is all around the at least one current limiting region.

5. The semiconductor device according to claim 1, wherein a volume of the at least one current limiting region is at least 10% and at most 95% of an overall volume of the first region.

6. The semiconductor device according to claim 1, wherein an electrical conductivity of the at least one current limiting region is between 5% and 90% of an electrical conductivity of remaining regions of the first region, wherein a crystal lattice in the at least one current limiting region has by at least a factor of two more defects than the remaining regions of the first region.

7. The semiconductor device according to claim 1, wherein the semiconductor body further comprises a drift region which is of the first conductivity type and also comprises a second region which is a drain region or a collector region, wherein the drift region is located between the well region and the second region, wherein the semiconductor device further comprises a second electrode which is a collector electrode or a drain electrode, the second electrode is located on a side of the second region remote from the drift region, and wherein the semiconductor body is of SiC.

8. The semiconductor device according to claim 1, wherein, seen in top view of the semiconductor body, the gate electrode and the first electrode each extend along a straight line, the first region extends in parallel with the gate electrode and the first electrode, or wherein, seen in top view of the semiconductor body, the gate electrode and the first electrode each comprise a plurality of sub-sections arranged along at least one arrangement line, the first region extends between adjacent sub-sections of the gate electrode and the first electrode.

9. The semiconductor device according to claim 1, wherein there is the exactly one current limiting region in the first region.

10. The semiconductor device according to claim 1, wherein there is a plurality of the current limiting regions in the first region, the current limiting regions are distant from one another, seen in top view of the semiconductor body.

11. A manufacturing method for a semiconductor device according to claim 1, the method comprises:

providing the semiconductor body, forming the first region and the well region in the semiconductor body, applying a mask layer on the semiconductor body, irradiation at least one portion of the first region defined by the mask layer with at least one of x-ray, electrons, protons, neutrons or ions so that the at least one current limiting region is created in the at least one irradiated portion, and applying the gate insulator layer as well as the gate electrode and the first electrode to the semiconductor body.

* * * * *